United States Patent
Park et al.

(12)

(10) Patent No.: US 11,822,260 B2
(45) Date of Patent: Nov. 21, 2023

(54) APPARATUS FOR REMOVING RESIDUE OF EUV LIGHT SOURCE VESSEL

(71) Applicant: Samsung Electronics Co., Ltd., Suwon-si (KR)

(72) Inventors: Jongbin Park, Gangneung-si (KR); Minseok Choi, Hwaseong-si (KR); Inho Choi, Seoul (KR); Jeonggil Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/939,293

(22) Filed: Sep. 7, 2022

(65) Prior Publication Data

US 2023/0144163 A1 May 11, 2023

(30) Foreign Application Priority Data

Nov. 8, 2021 (KR) .................. 10-2021-0152049

(51) Int. Cl.
*G03F 7/20* (2006.01)
*G03F 7/00* (2006.01)

(52) U.S. Cl.
CPC ...... *G03F 7/70925* (2013.01); *G03F 7/70033* (2013.01); *G03F 7/7085* (2013.01); *G03F 7/70975* (2013.01)

(58) Field of Classification Search
CPC ...... G03F 7/70925; G03F 7/7085; G03F 7/70; G03F 7/70908–70941; G03F 7/70975; G03F 7/70991; G03F 7/70141; G03F 7/70008; G03F 7/70033; G03F 7/70858; G03F 7/70883; G03F 7/70891; H05G 2/00–008

USPC .................. 355/30, 52–55, 67–77; 250/492.1–492.23, 493.1, 496.1–498.1, 250/503.1, 504 R, 505.1; 134/107
See application file for complete search history.

(56) References Cited

U.S. PATENT DOCUMENTS

| | | | |
|---|---|---|---|
| 10,165,664 B1 | 12/2018 | Chen et al. | |
| 10,362,664 B2 | 7/2019 | Baek et al. | |
| 10,656,539 B2 | 5/2020 | Wu et al. | |
| 11,048,179 B2 | 6/2021 | Yu et al. | |
| 2007/0145295 A1 * | 6/2007 | Banine ............. | G03F 7/70933 250/492.2 |

(Continued)

FOREIGN PATENT DOCUMENTS

| | | | |
|---|---|---|---|
| CN | 111948911 A | 11/2020 | |
| WO | WO-2019086397 A1 * | 5/2019 | ......... G03F 7/70033 |

*Primary Examiner* — Christina A Riddle
(74) *Attorney, Agent, or Firm* — Harness, Dickey & Pierce, P.L.C.

(57) ABSTRACT

An apparatus for removing a residue of an EUV light source vessel including an internal side surface having a curved surface is provided. The apparatus includes a frame portion configured to be disposed on a bottom surface of an EUV light source vessel and a head portion above the frame portion. The head portion is configured to be rotatably moved on a circular trajectory while maintaining a desired (and/or alternatively predetermined) distance from the curved surface of the EUV light source vessel. The head portion may have a heating member configured to emit heat toward the curved surface of the EUV light source vessel. The heating member may have a shape curved in an arc corresponding to a portion of the circular trajectory.

20 Claims, 8 Drawing Sheets

(56) References Cited

U.S. PATENT DOCUMENTS

| | | | |
|---|---|---|---|
| 2017/0059998 A1* | 3/2017 | Kim | G03F 7/70033 |
| 2017/0142817 A1* | 5/2017 | Kuritsyn | H05G 2/008 |
| 2020/0146136 A1 | 5/2020 | Yu et al. | |
| 2020/0348241 A1 | 11/2020 | Chang et al. | |
| 2020/0363736 A1* | 11/2020 | Yu | H05G 2/005 |
| 2022/0408538 A1* | 12/2022 | Lu | G03F 7/7085 |

\* cited by examiner

APPARATUS FOR REMOVING RESIDUE OF EUV LIGHT SOURCE VESSEL

CROSS-REFERENCE TO RELATED APPLICATION

This application claims the priority and benefit of Korean Patent Application No. 10-2021-0152049, filed on Nov. 8, 2021 with the Korean Intellectual Property Office, the entire contents of which are incorporated herein by reference.

BACKGROUND

1. Field

Inventive concepts relate to an apparatus for removing a residue of an EUV light source vessel.

2. Description of Related Art

In general, when an Extreme Ultraviolet (EUV) exposure device is used for a certain period of time, tin residues that are not discharged may adhere to an inside of the EUV light source vessel. These tin residues may interfere with normal operations of EUV light sources and must be removed periodically. However, it may take a long period of time to remove the tin residues from the EUV light source vessel, which may lower the productivity of the extreme ultraviolet exposure device.

SUMMARY

An aspect of inventive concepts is to provide an apparatus for removing a residue for an EUV light source vessel that can reduce a time for a maintenance and repair operation of the EUV light source vessel.

According to an embodiment of the inventive concepts, an apparatus for removing a residue of an EUV light source vessel is provided. The EUV light source vessel may include an internal side surface having a curved surface. The apparatus may include a frame portion configured to be disposed on a bottom surface of the EUV light source vessel and a head portion above the frame portion. The head portion may be configured to be rotatably moved on a circular trajectory while maintaining a desired (and/or alternatively predetermined) distance from the curved surface of the EUV light source vessel. The head portion may have a heating member configured to emit heat toward the curved surface of the EUV light source vessel. The heating member may have a shape curved in an arc corresponding to a portion of the circular trajectory in which the head portion may be configured to be rotatably moved.

According to an embodiment of inventive concepts, an apparatus for removing a residue of an EUV light source vessel is provided. The EUV light source vessel may include an internal side surface having a curved surface and the residue may be attached to the curved surface. The EUV light source vessel may include a frame portion configured to be disposed on a bottom surface of the EUV light source vessel, a head portion above the frame portion and configured to be rotatably moved on a circular trajectory while maintaining a desired (and/or alternatively predetermined) distance from the curved surface of the EUV light source vessel, and a controller configured to control power applied to the heating member. The head portion may include a heating member configured to emit heat toward the curved surface of the EUV light source vessel. The heating member may have a shape curved in an arc corresponding to a portion of the circular trajectory in which the head portion is configured to be rotatably moved.

According to an embodiment of inventive concepts, an apparatus for removing a residue of an EUV light source vessel may include a frame portion and a head portion above the frame portion. The head portion may be configured to be rotatably moved on a circular trajectory and to emit heat toward an outside of the circular trajectory. The head portion may include a heating member, a cover, and a body. The heating member may have a shape curved in an arc corresponding to a portion of the circular trajectory in which the head portion is configured to be rotatably moved. The cover may have an internal space in which the heating member is disposed. The body may support the cover and may have an opening defining a region in which the cover is exposed toward an outside of the circular trajectory.

BRIEF DESCRIPTION OF DRAWINGS

The above and other aspects, features, and advantages of inventive concepts will be more clearly understood from the following detailed description taken in conjunction with the accompanying drawings, in which.

DETAILED DESCRIPTION

Hereinafter, example embodiments of inventive concepts will be described with reference to the accompanying drawings as follows.

An extreme ultraviolet light source system and an extreme ultraviolet exposure facility in which an apparatus for removing a residue for an EUV light source vessel according to an example embodiment is used will be described with reference to FIGS. 1 and 2.

Figure 1:
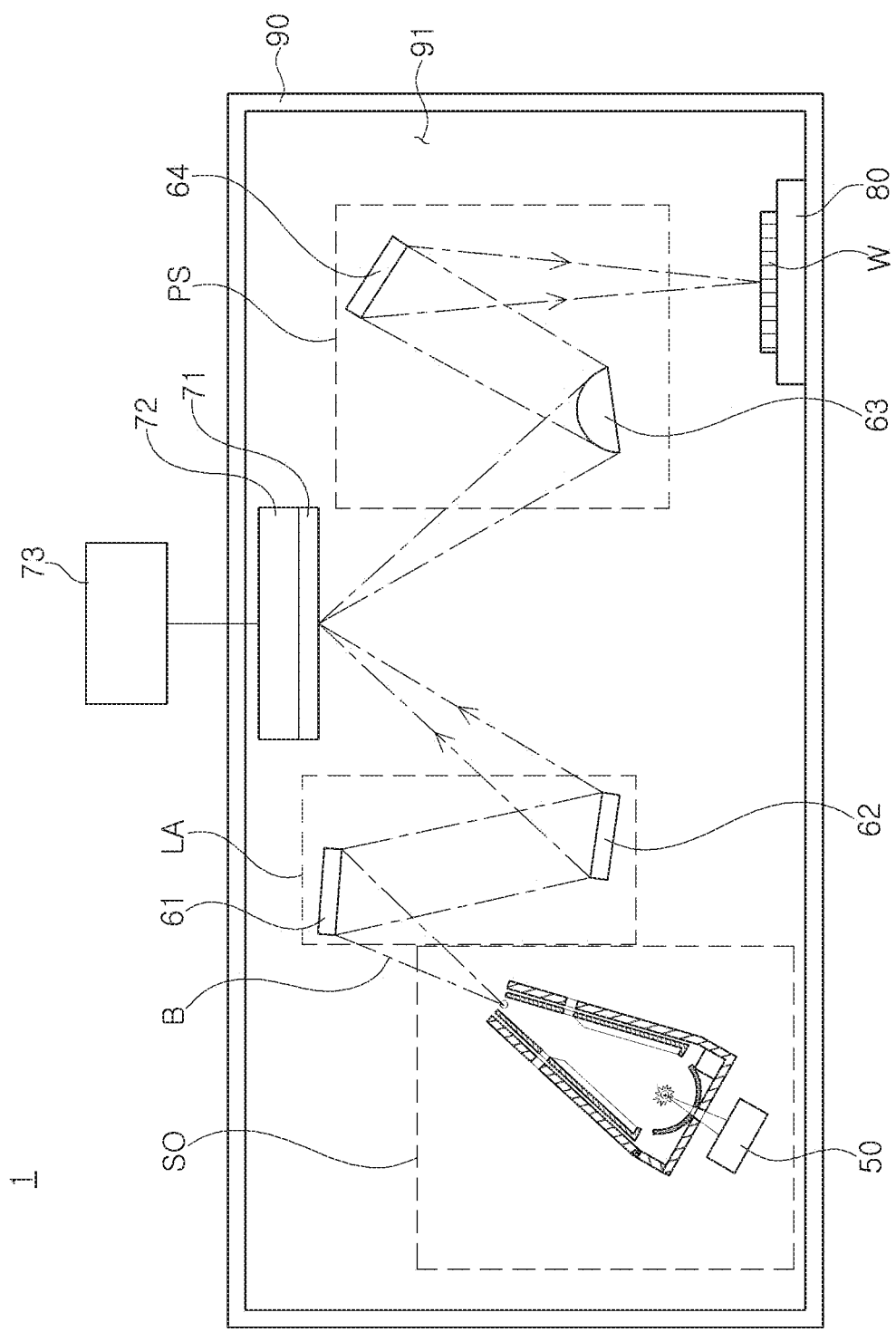
FIG. 1 is a schematic configuration diagram illustrating an extreme ultraviolet exposure facility in which an apparatus for removing a residue for an EUV light source vessel according to an example embodiment of inventive concepts is used.
Figure 2:
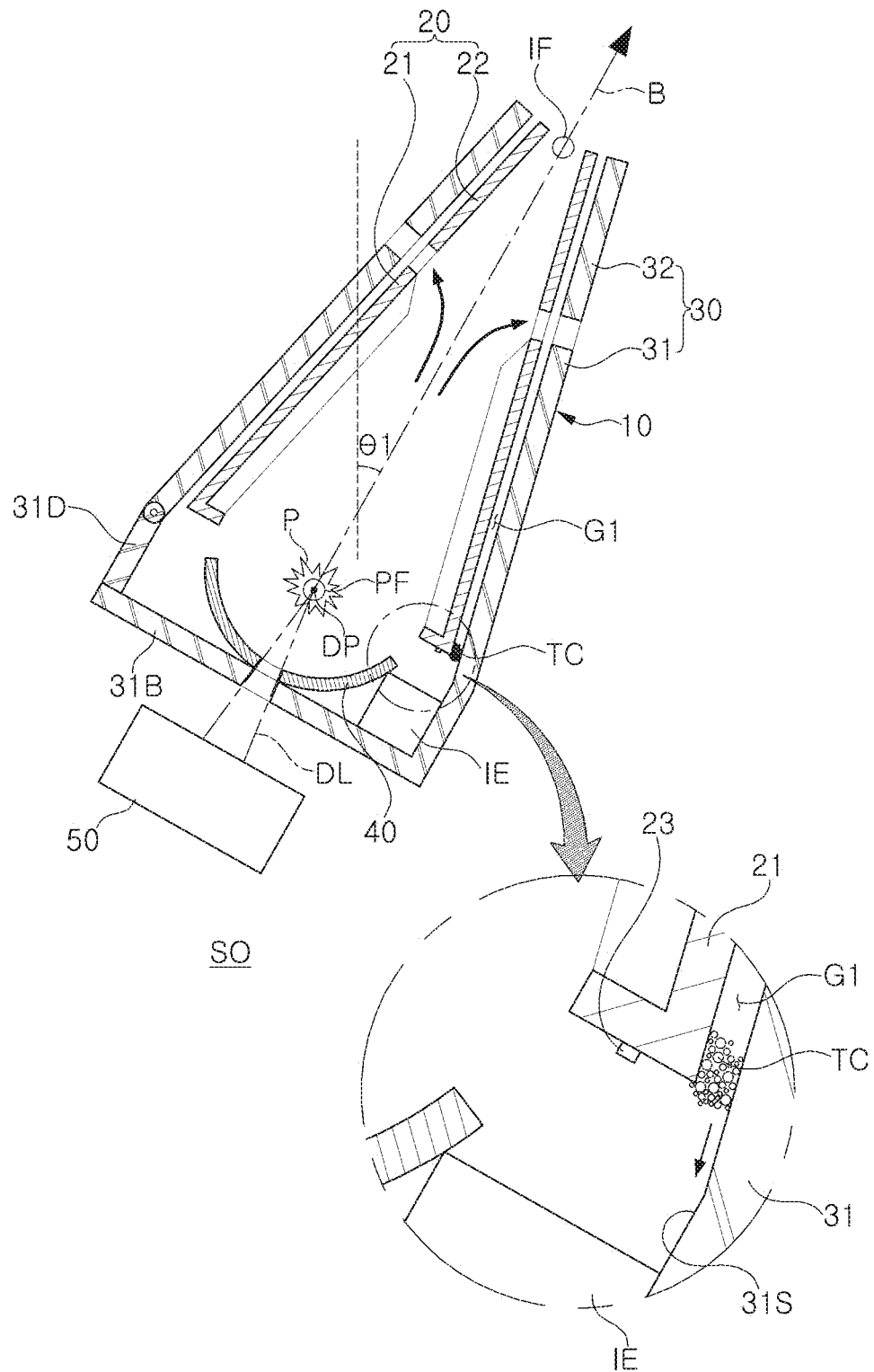
FIG. 2 is a schematic side view of the EUV light source vessel of FIG. 1.

FIG. 1 is a schematic configuration diagram illustrating an extreme ultraviolet exposure facility in which an apparatus for removing a residue for an EUV light source vessel according to an example embodiment of inventive concepts is used, and FIG. 2 is a schematic side view of the EUV light source vessel of FIG. 1.

Referring to FIG. 1, an extreme ultraviolet exposure facility 1 may include an exposure chamber 90, an extreme ultraviolet light source system SO, a lithographic apparatus LA, a projection system PS, and an upper electrostatic chuck 72, and a lower electrostatic chuck 80.

The exposure chamber 90 may have an internal space 91, and in the internal space 91, the extreme ultraviolet light source system SO, the lithographic apparatus LA, the projection system PS, the upper electrostatic chuck 72 and the lower electrostatic chuck 80 may be disposed. A mask 71 may be loaded/unloaded from the upper electrostatic chuck 72 by an electrostatic force generated by power applied from a power supply 73, and a substrate W may be loaded/unloaded from the lower electrostatic chuck 80. For example, the substrate W may be a semiconductor wafer.

The extreme ultraviolet light source system SO may generate extreme ultraviolet light B having a wavelength of less than about 100 nm and supply the same to the lithographic apparatus LA. The extreme ultraviolet light source system SO will be described in detail later.

The lithographic apparatus LA may include a plurality of mirrors to irradiate the extreme ultraviolet light B emitted from the extreme ultraviolet light source system SO in a direction of the upper electrostatic chuck 72. Since a plurality of mirrors included in the lithographic apparatus LA have a known structure, only two mirrors 61 and 62 are shown for the sake of simplification and convenience of description.

The projection system PS may include a plurality of mirrors, and project a pattern of extreme ultraviolet light B reflected from a mask 71 attached to the upper electrostatic chuck 72 to the substrate W disposed on the lower electrostatic chuck 80, to expose the pattern on a surface of the substrate W. Since the plurality of mirrors included in the projection system PS have a known structure, only the two mirrors 63 and 64 are shown for the sake of simplification and convenience of description.

Referring to FIGS. 1 and 2, the extreme ultraviolet light source system SO may include an EUV light source vessel 10 and a light source 50. Although not illustrated, the extreme ultraviolet light source system SO may further include a droplet supply apparatus for supplying droplets DP into the EUV light source vessel 10.

The EUV light source vessel 10 may include an internal vessel 20 and an external vessel 30. The EUV light source vessel 10 may be disposed to be inclined at a desired (and/or alternatively predetermined) angle in an exposure chamber 90. In an example embodiment, the EUV light source vessel 10 may be disposed to be inclined at an angle θ1 of about 28° with respect to a normal line, perpendicular to a bottom surface of the exposure chamber 90.

The internal vessel 20 may be disposed inside the external vessel 30. The internal vessel 20 may be a cone-shaped cover narrowing toward an upper portion thereof, and an intermediate focus IF providing a path through which the generated extreme ultraviolet light B is emitted may be located at an end portion of the cone. The internal vessel 20 may include a lower internal vessel 21 having a vane disposed on an inner surface thereof, and an upper internal vessel 22 disposed on an upper portion of the lower internal vessel 21 and having an intermediate focus IF therein. According to an example embodiment, an internal temperature sensor 23 for measuring a temperature of the internal vessel 20 may be disposed on a lower surface of the lower internal vessel 21. The internal temperature sensor 23 may be connected to a controller 150 to be described later through wired or wireless communication. The internal temperature sensor 23 may transmit a temperature value of the internal vessel 20 to the controller 150.

The external vessel 30 may include a lower external vessel 31 and an upper external vessel 32 disposed above the lower external vessel 31. An EUV collector 40 may be disposed on a bottom surface 31B of the lower external vessel 31, and a door 31D for inserting and withdrawing the EUV collector 40 may be disposed on one side surface of the lower external vessel 31. At least a portion of the inner surface 31S of the lower external vessel 31 may be formed of a curved surface.

Laser light DL oscillated from a light source 50 may be supplied into the EUV light source vessel 10 to generate extreme ultraviolet light B. Specifically, the laser light DL supplied into the EUV light source vessel 10 may be irradiated to droplets DP made of any one of tin (Sn), lithium (Li), and xenon (Xe) at a primary focus PF, to generate plasma P for radiating extreme ultraviolet light B. The EUV collector 40 disposed inside the EUV light source vessel 10 may collect the extreme ultraviolet light B radiated in all directions from the plasma P and concentrate the extreme ultraviolet light B to the intermediate focus IF, and then provide the same to the lithographic apparatus LA.

The droplet DP irradiated with the laser light DL explodes, leaving a residue TC in the EUV light source vessel 10. A portion of the residue TC may be inserted into a flow path G1 between the internal vessel 20 and the external vessel 30 of the EUV light source vessel 10. The residue TC inserted into the flow path G1 between the internal vessel 20 and the external vessel 30 may be collected in a relatively low region of the flow path G1 by gravity, and be moved along the internal side surface 31S of the lower external vessel 31 and be accommodated in the residue collector IE and removed. However, the residue TC collected in the lower region may be easily cooled and adhered to the internal side surface 31S of the lower external vessel 31. The residue TC adhered to the internal side surface 31S may block the flow path G1, and may interfere with a normal operation of the extreme ultraviolet light source system SO. The apparatus for removing a residue for an EUV light source vessel according to an example embodiment may be used to heat and remove the residue TC adhered to the extreme ultraviolet light source system SO.

Figure 3:
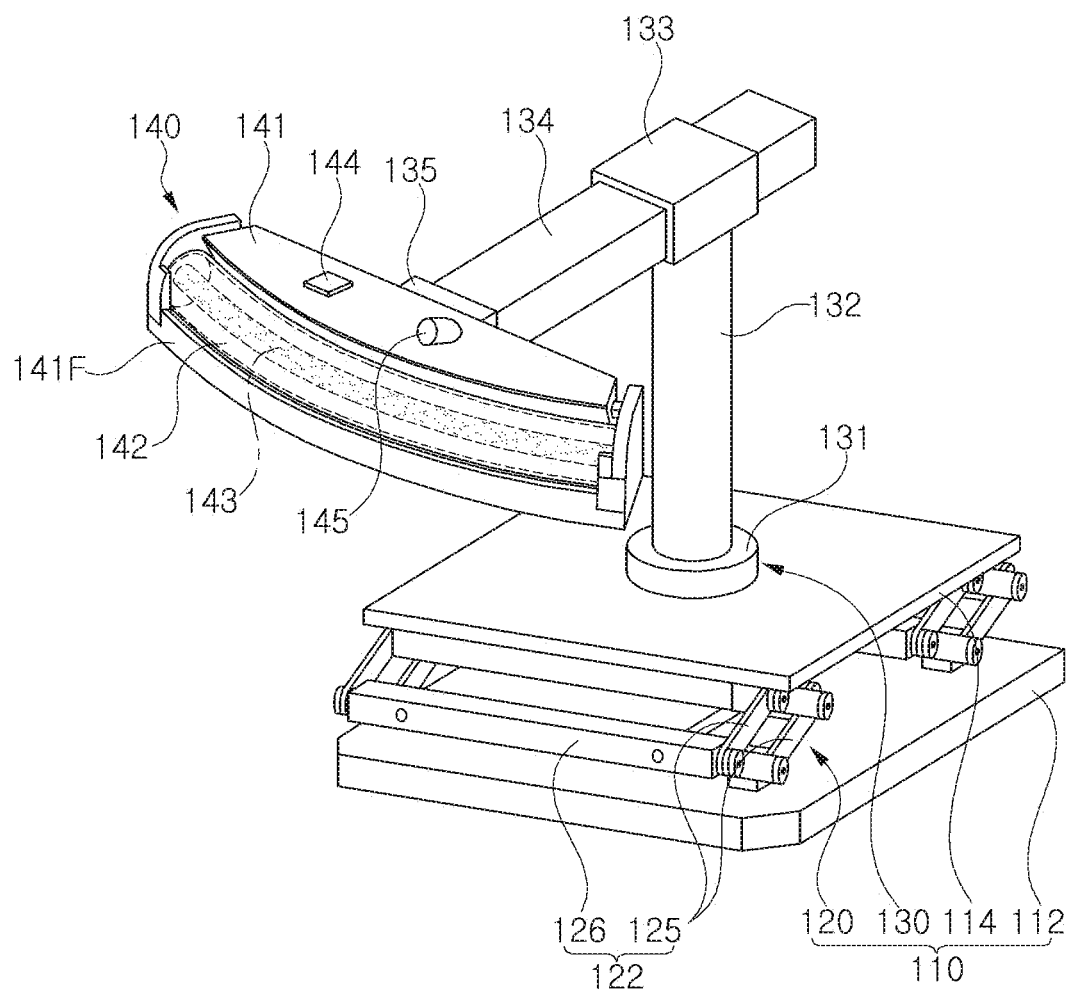
FIG. 3 is a perspective view of an apparatus for removing a residue for an EUV light source vessel according to an example embodiment.
Figure 4:
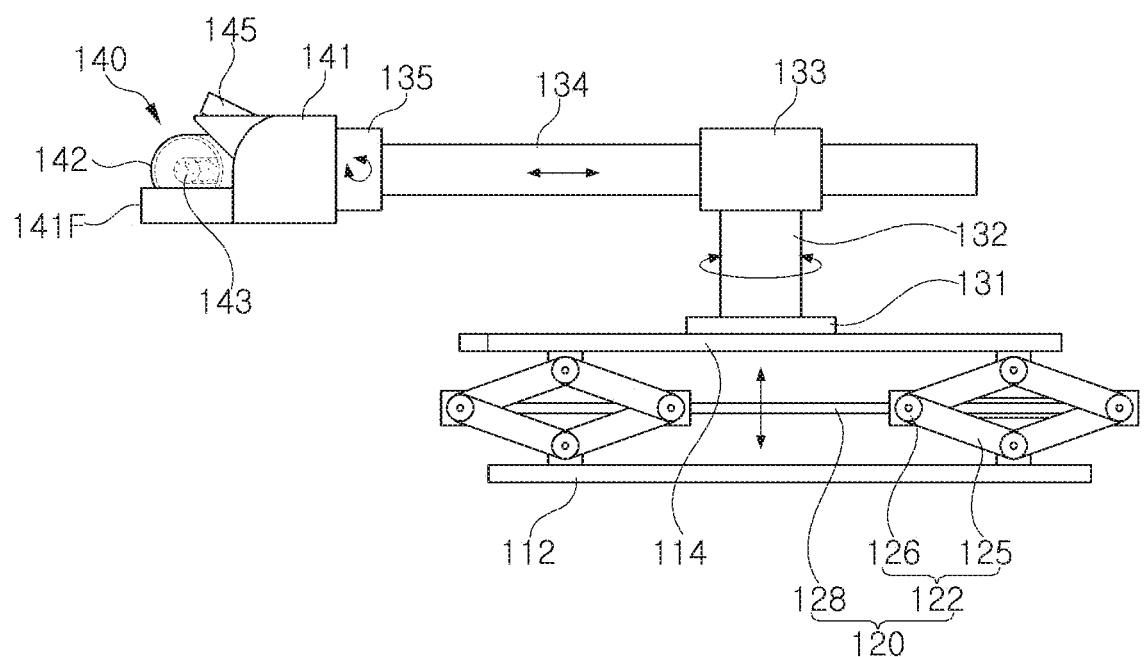
FIG. 4 is a side view of the apparatus for removing a residue for a EUV light source vessel of FIG. 3.
Figure 5A:
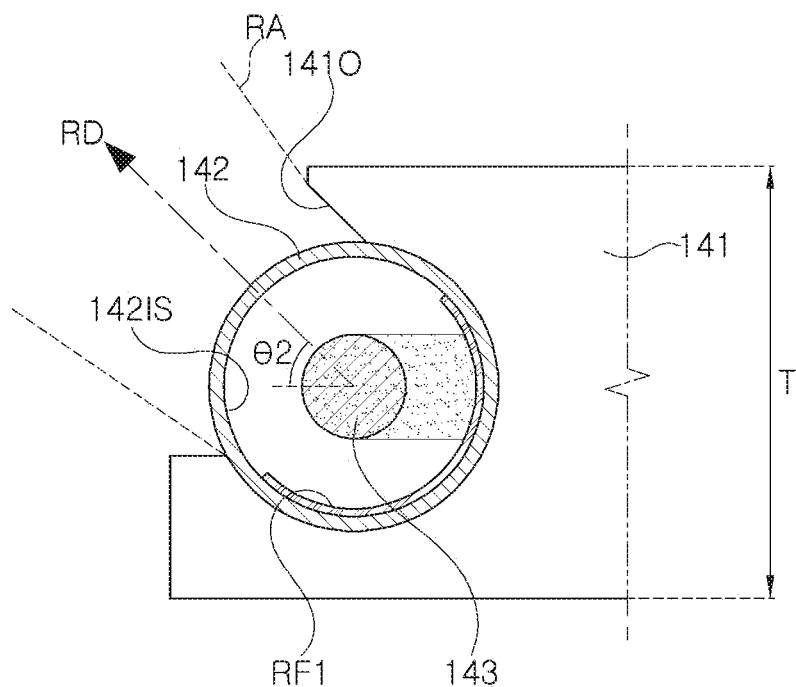
FIGS. 5A and 5B are views illustrating various modifications of head portions of the apparatus for removing a residue for an EUV light source vessel according to an example embodiment of inventive concepts.
Figure 5B:
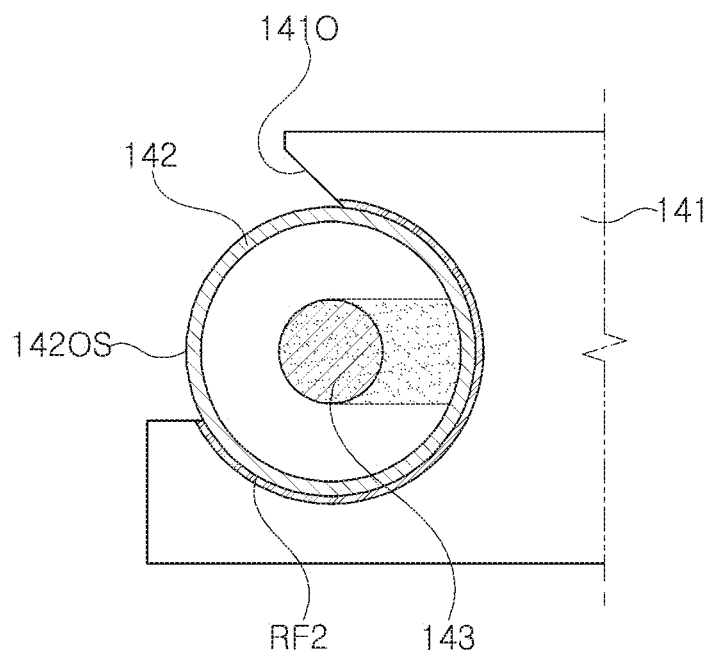
Figure 6:
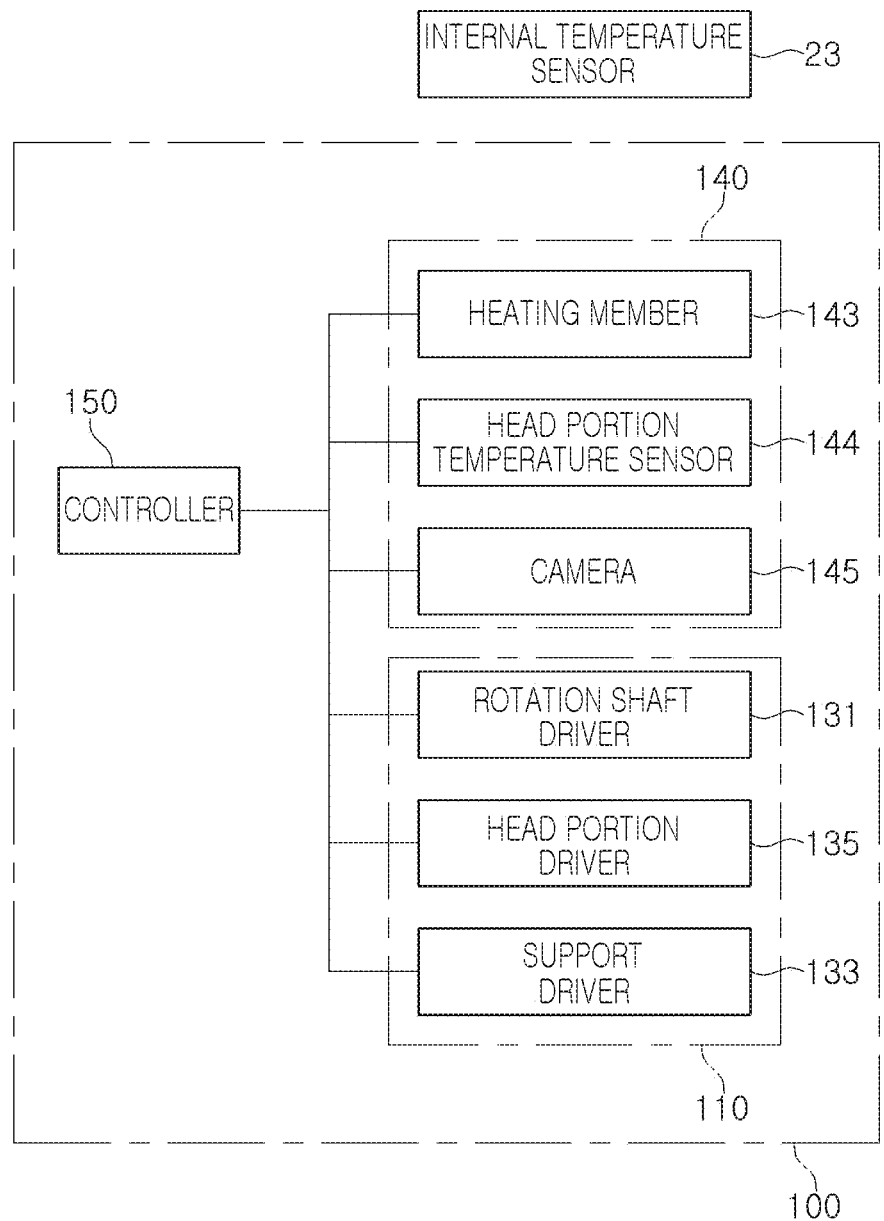
FIG. 6 is a block diagram of an apparatus for removing a residue for an EUV light source vessel according to an example embodiment of inventive concepts.

An apparatus for removing a residue for an EUV light source vessel 100 according to an example embodiment will be described with reference to FIGS. 3 to 6. FIG. 3 is a perspective view of an apparatus for removing a residue for an EUV light source vessel, and FIG. 4 is a side view of the apparatus for removing a residue for an EUV light source vessel of FIG. 3. FIGS. 5A and 5B are views illustrating various modifications of head portions of an apparatus for removing a residue for an EUV light source vessel according to an example embodiment of inventive concepts. FIG. 6 is a block diagram of an apparatus for removing a residue for an EUV light source vessel according to an example embodiment.

Referring to FIGS. 3 and 4, the apparatus for removing a residue for an EUV light source vessel 100 may include a frame portion 110 and a head portion 140 installed on the frame portion 110. In addition, referring to FIG. 6, each configuration of the apparatus for removing a residue for an EUV light source vessel 100 may be controlled by a controller 150.

The controller 150 may be disposed inside the apparatus for removing a residue for an EUV light source vessel 100, or may be separately disposed outside the apparatus for removing a residue for an EUV light source vessel 100. The controller 150 is for controlling an overall operation of the apparatus for removing a residue for an EUV light source vessel 100, and may control operations of a heating member 143, a head portion temperature sensor 144, a camera 145, a rotation shaft driver 131, a head portion driver 135, and a support driver 133. In addition, the controller 150 may receive a temperature value of the internal vessel 20 from the internal temperature sensor 23 disposed in the internal vessel 20. For example, the controller 150 may be implemented with processing circuitry such as a processor such as a central processing unit (CPU), a graphic processing unit (GPU), a microprocessor, an application specific integrated circuit (ASIC), or a field programmable gate arrays (FPGA). In addition, the controller 150 may include a memory for storing various data necessary for the operation of the apparatus for removing a residue for an EUV light source vessel 100.

The frame portion 110 is a support for installing the head portion 140, and may move the head portion 140. The frame portion 110 may include a first plate 112, a second plate 114, a lifting assembly 120, and a rotation hardware assembly 130. However, inventive concepts are not limited thereto, and the configuration of the frame portion 110 may be variously modified.

For example, the first plate 112 may have a rectangular plate shape. The first plate 112 may have a size that can be inserted into and withdrawn from the EUV light source vessel 10 through the door 31D described above.

The second plate 114 may be disposed to be spaced apart from the first plate 112. In addition, the second plate 114 may have a shape corresponding to the first plate 112. For example, the second plate 114 may have a rectangular plate shape, and may have a size corresponding to the size of the first plate 112. A lifting assembly 120 may be disposed between the first plate 112 and the second plate 114.

The lifting assembly 120 may raise and lower the second plate 114 to adjust a vertical height of the head portion 140 disposed on the second plate 114.

For example, the lifting assembly 120 may include a folding member 122 and a connecting bar 128. The folding member 122 may have one end connected to the first plate 112 and the other end connected to the second plate 114. According to an example embodiment, the folding member 122 may be installed at a front end portion and a rear end portion of the first and second plates 112 and 114, respectively. However, inventive concepts are not limited thereto, and only one folding member 122 may be disposed in a central portion the first and second plates 112 and 114. The folding member 122 may include a folding link portion 125 having one end connected to the first plate 112 and the other end connected to the second plate 114 and a connection portion 126 connecting the folding link portion 125 and through which the connection bar 128 is installed.

The folding link portion 125 is disposed to form a pair on both side surfaces of the first and second plates 112 and 114, and the connection portion 126 connects the folding link portion 125. Meanwhile, the connection portion 126 may be provided with a through hole (not shown) through which the connecting bar 128 is disposed. A screw portion (not shown) may be formed in the through hole so that the connection portion 126 may be moved when the connection portion 126 rotates.

The connecting bar 128 may be connected to the folding member 122 and can fold the folding member 122 by rotation. That is, when the connecting bar 128 is rotated, the connection portion 126 of the folding member 122 may move along the connecting bar 128. Accordingly, the second plate 114 may be raised and lowered while the folding link portion 125 installed in the connection portion 126 is folded. The connecting bar 128 may be rotated manually or may be rotated by a driver such as a motor.

The rotation hardware assembly 130 may be installed on an upper surface of the second plate 114, and may be connected to the head portion 140 to rotate the head portion 140.

The rotation hardware assembly 130 may include a rotation shaft 132 and a support 134. According to an example embodiment, a rotation shaft driver 131 for rotationally driving the rotation shaft 132 may be further disposed below the rotation shaft 132. In addition, according to an example embodiment, a support driver 133 for linearly driving the support 134 back and forth may be further disposed on an upper portion of the rotation shaft 132. In addition, according to an example embodiment, a head portion driver 135 for tilting the head portion 140 may be further disposed at an end portion of the support 134. The rotation shaft driver 131, the head portion driver 135, and the support driver 133 may be controlled by the controller 150. Features of the rotation hardware assembly 130 may be moved and rotating using a motor, but are not limited thereto.

The rotation shaft 132 may be vertically disposed on an upper surface of the second plate 114, and the support 134 may be horizontally connected to the rotation shaft 132, and rotatably moved according to the rotation of the rotation shaft 132. The rotation shaft 132 may be installed at a position that can be disposed at a center C of the EUV light source vessel 10 when the apparatus for removing a residue for an EUV light source vessel 100 is inserted into the EUV light source vessel 10. Accordingly, as the rotation shaft 132 rotates, the head portion 140 may rotate while maintaining a desired (and/or alternatively predetermined) distance from the internal side surface 31S of the EUV light source vessel 10.

The head portion 140 may be disposed above the frame portion 110, and may be used to heat the residue TC adhered to the internal side surface 31S of the EUV light source vessel 10. The head portion 140 may be connected to the rotation hardware assembly 130 and may be rotatably installed along a circular trajectory CT while maintaining a desired (and/or alternatively predetermined) distance from the internal side surface 31S of the EUV light source vessel 10 (see FIG. 8). In addition, the head portion 140 may emit heat toward the internal side surface 31S of the EUV light source vessel 10, which is outside the circular trajectory CT. In an example embodiment, a case in which the apparatus for removing a residue for an EUV light source vessel 100 include one head portion 140 is described as an example, but inventive concepts are not limited thereto, and a plurality of head portions 140 may be provided. In this case, the plurality of head portions 140 may be arranged along the circular trajectory CT to correspond to the shape of the internal side surface 31S of the EUV light source vessel 10. The head portion 140 may have a small thickness T so that it can be inserted into a narrow space between the lower internal vessel 21 and the residue collector IE among the inside of the EUV light source vessel 10 (see FIG. 5A). For example, the thickness T of the head portion 140 may be about 10 cm or less. In some embodiments, the thickness T of the head portion 140 may be about 5 to 8 cm.

The head portion 140 may include a body 141, a cover 142, and a heating member 143. In addition, the head portion 140 may further include a camera 145 and a head portion temperature sensor 144. In addition, according to an example embodiment, the head portion 140 may further include a cooling device (e.g., fan, thermoelectric device) for limiting and/or preventing the head portion 140 from being overheated.

The heating member 143 is a member capable of generating high-temperature heat, and in an example embodiment, the heating member 143 may be formed of a halogen lamp. However, inventive concepts are not limited thereto, and the heating member 143 may be formed of a coil emitting heat by an induced current.

The heating member 143 may be controlled to generate heat equal to or greater than a melting point at which a residue TC of the internal side surface 31S of the EUV light source vessel 10 is melted. When the residue TC is tin, the heating member 143 may be controlled to generate heat of 232° C. or higher, which is a melting point of tin.

Meanwhile, the heating member 143 may be formed to have a curved surface corresponding to the internal side surface 31S of the EUV light source vessel 10. The heating member 143 may be formed in a shape capable of maintaining a desired (and/or alternatively predetermined) distance G2 with the internal side surface 31S of the EUV light source vessel 10 when the head portion 140 rotates along a circular trajectory CT (see FIG. 8). For example, the heating member 143 may have a shape curved in an arc, a portion of the circular trajectory CT in which the head portion 140 rotates.

The cover 142 may be formed in a long hollow tube shape in one direction while surrounding a heating member 143, and the heating member 143 may be disposed on a central axis of the hollow tube. That is, the cover 142 may have a shape in which a central axis is curved in an arc to correspond to the shape of the heating member 143.

The cover 142 may be made of a light-transmitting material that can protect the heating member 143 while effectively transmitting heat emitted from the heating member 143. For example, the cover 142 may be a quartz glass tube.

Referring to FIG. 5A, a reflective surface RF1 for reflecting heat emitted from the heating member 143 toward a front surface thereof may be formed on an inner surface 142IS of the cover 142. The reflective surface RF1 may be disposed so that heat emitted from the heating member 143 is reflected in a specific direction. However, depending on example embodiments, a reflective surface RF2 may be disposed on an outer surface 1420S of the cover 142 (refer to FIG. 5B). In this case, a reflective surface RF2 may be formed directly on the outer surface 1420S of the cover 142, or may be formed on an internal side surface of the body 141 in contact with the cover 142.

The body 141 is a support for fixing the cover 142 and the heating member 143, and may be a housing formed of a metal material having excellent heating efficiency. A cover 142, a curved hollow, may be coupled on a front surface of the body 141, and a curved heating member 143 may be disposed along a central axis of the cover 142. A support 134 may be connected to a rear surface of the body 141. A front surface 141F of the body 141 is formed in a curved surface similar to the shape of the cover 142 and the heating member 143, and when the head portion 140 rotates along the circular trajectory CT, the front surface 141F of the body 141 may maintain a desired (and/or alternatively predetermined) distance from the inner surface 31S of the EUV light source vessel 10 (refer to FIG. 8).

Referring to FIG. 5A, an opening 1410 for limiting an irradiation range RA of heat emitted from the heating member 143 may be formed on a front surface of the body 141. The opening 1410 may be formed to face upwards of a front surface of the body 141 so that a main direction RD of heat irradiated through the opening 1410 forms a desired (and/or alternatively predetermined) angle θ2. In the case of an example embodiment, the desired (and/or alternatively predetermined) angle θ2 is an angle toward a region to which the residue TC is easily fixed among the inner surface 31S of the EUV light source vessel 10, and may be about 60°.

Meanwhile, the head portion 140 may further include a head portion temperature sensor 144, such as a thermocouple or a thermistor. In an example embodiment, a case in which the head portion temperature sensor 144 is disposed on an upper surface of the head portion 140 will be described as an example, but inventive concepts are not limited thereto. The head portion temperature sensor 144 may measure a temperature of the head portion 140 and/or a temperature of the heating member 143. The head portion temperature sensor 144 may be connected to a controller 150 and transmit the measured temperature of the head portion 140 and/or a temperature value of the heating member 143 to the controller 150. The controller 150 may control power applied to the heating member 143 based on the temperature of the head portion 140 and/or the temperature of the heating member 143 to limit and/or prevent overheating of the head portion 140, and the temperature of the heating member 143 may be controlled.

In addition, the head portion 140 may further include a camera 145. The camera 145 may be disposed to face an upper portion of a front surface of the head portion 140, to form an image of one region of the internal side surface 31S of the EUV light source vessel 10. The camera 145 may be connected to a controller 150 and transmit the formed image to the controller 150. The controller 150 may image-process the image received from the camera 145 to detect a position of the residue TC in the formed image.

Hereinafter, an operation of an apparatus for removing a residue of an EUV light source vessel according to an example embodiment will be described with reference to FIGS. 7 and 8.

Figure 7:
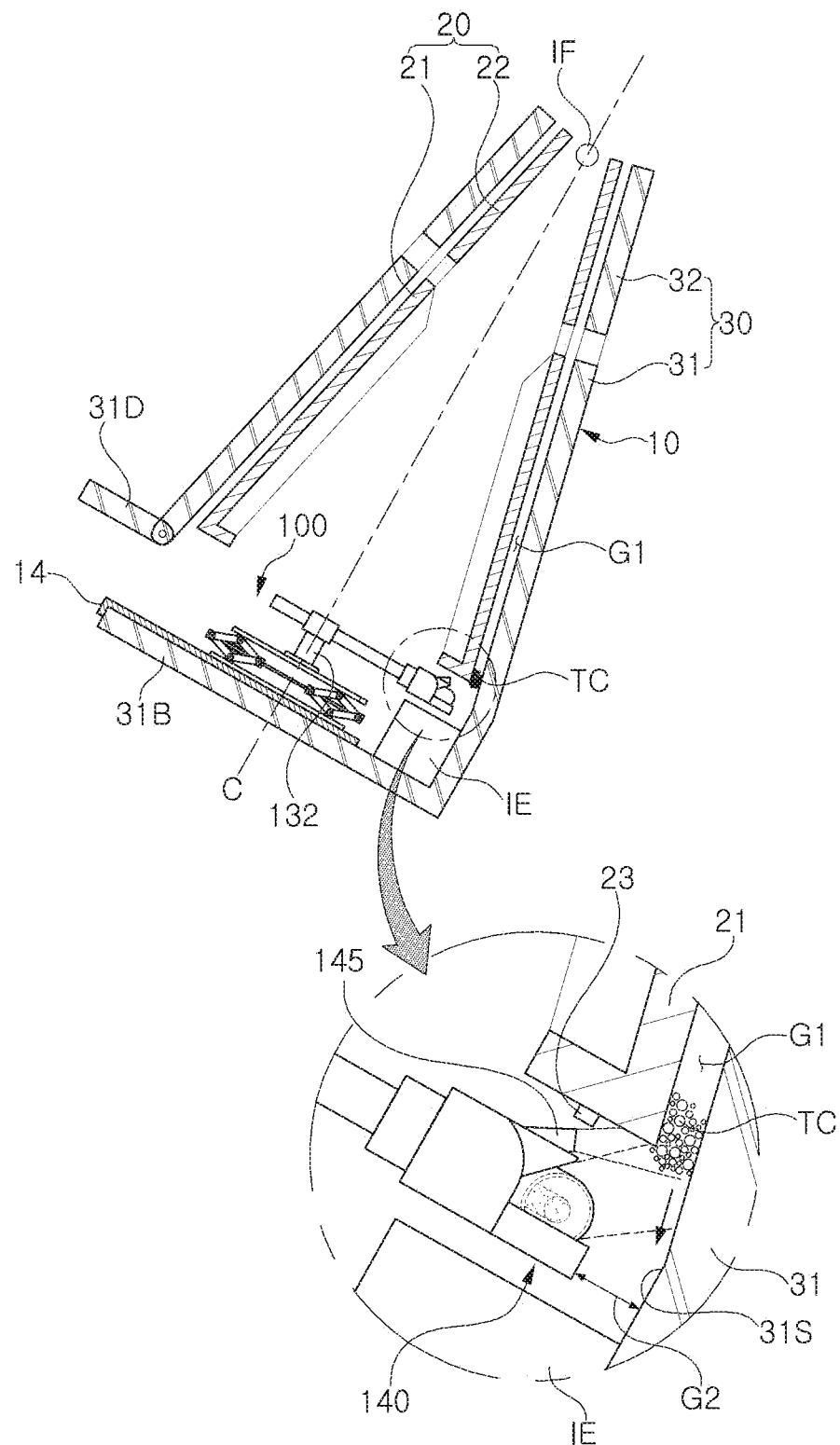
FIG. 7 is a schematic side view illustrating a state in which the EUV light source vessel of FIG. 2 is inserted into the apparatus for removing a residue for an EUV light source vessel according to an example embodiment of inventive concepts.
Figure 8:
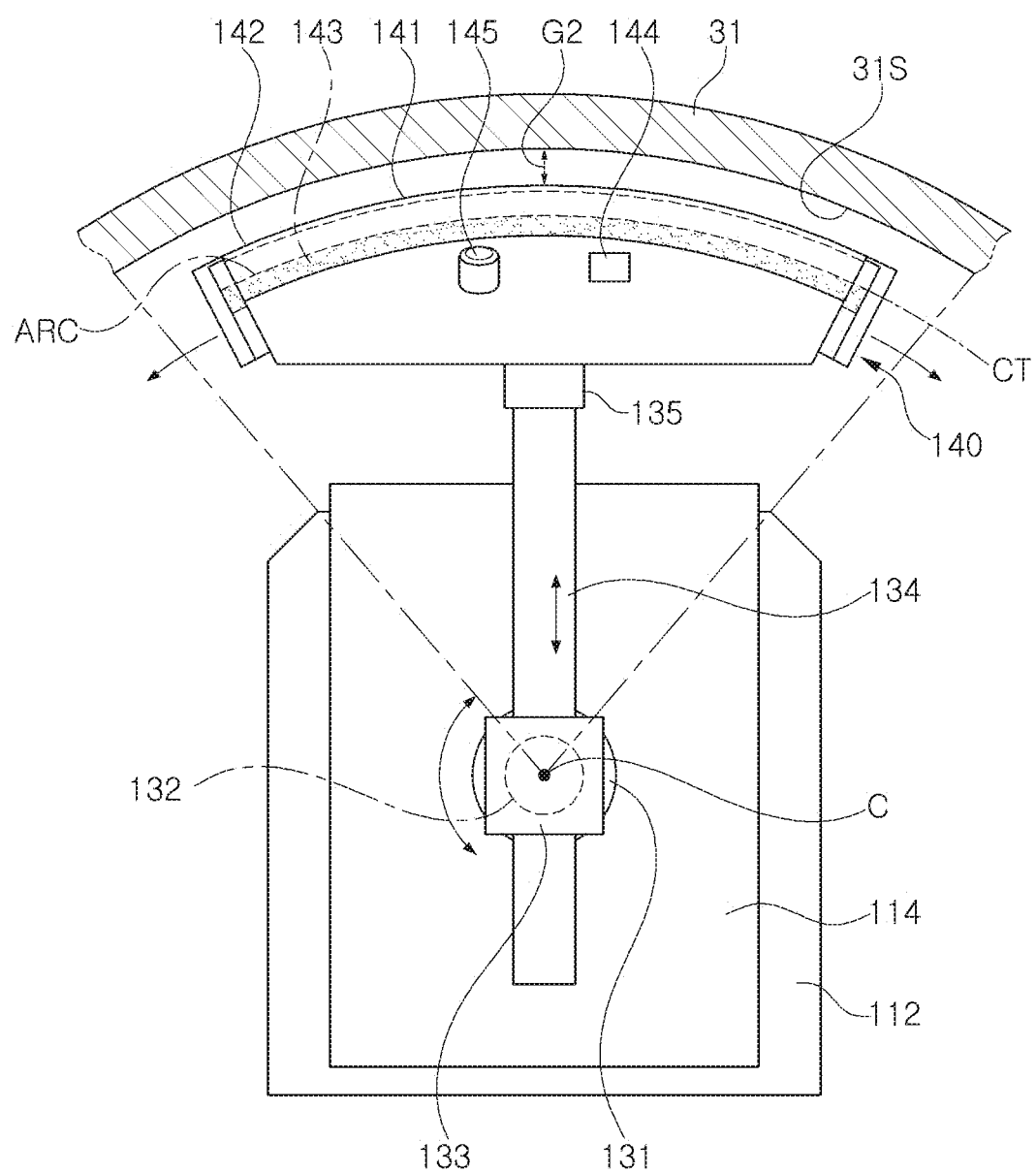
FIG. 8 is a plan view illustrating a state in which the EUV light source vessel of FIG. 2 is inserted into the apparatus for removing a residue for an EUV light source vessel according to an example embodiment of inventive concepts.

FIG. 7 is a schematic side view illustrating a state in which an apparatus for removing a residue for an EUV light source vessel according to an example embodiment of inventive concepts is inserted into the EUV light source vessel of FIG. 2, and FIG. 8 is a plan view illustrating a state in which an apparatus for removing a residue for an EUV light source vessel according to an example embodiment of inventive concepts is inserted into the EUV light source vessel of FIG. 2.

Referring to FIGS. 7 and 8, the apparatus for removing a residue for an EUV light source vessel 100 according to an example embodiment may be used for a maintenance and repair operation of the EUV light source vessel 10 according to an example embodiment. An EUV collector 40 of the EUV light source vessel 10 may be removed in advance before the maintenance and repair operation is performed. The apparatus for removing a residue for an EUV light source vessel 100 may be loaded on the loading plate 14 and inserted into the EUV light source vessel 10 through the door 31D. A loading plate 14 may be provided with a stepped portion that is fixedly attached to a bottom surface 31B of the EUV light source vessel 10 at one end thereof. The apparatus for removing a residue for an EUV light source vessel 100 may be disposed such that a rotation shaft 132 for rotatably moving a head portion 140 is aligned with a center C of the EUV light source vessel 10. In this case, the head portion 140 may be disposed to be positioned between a lower inner vessel 21 and a residue collector IE. A distance G2 between the head portion 140 and an internal side surface 31S of the EUV light source vessel 10 may be adjusted to a size that the head portion 140 can be rotated while maintaining the distance G2 from the internal side surface 31S of the EUV light source vessel 10.

The head portion 140 may irradiate light to the internal side surface 31S of the EUV light source vessel 10 through the heating member 143, and heat a residue TC adhering to the internal side surface 31S of the EUV light source vessel 10 and melt the same. The molten residue TC may descend along the internal side surface 31S to be accommodated in the residue collector IE, and the residue TC accommodated in the residue collector IE may be removed after the maintenance and repair operation is completed.

The controller 150 may control a rotation shaft driver 131 so that the head portion 140 rotatably moves along the inner surface 31S of the EUV light source vessel 10. In addition, the controller 150 may control the heating member 143 to adjust a temperature and an irradiation time of light irradiated from the heating member 143. The controller 150 may rotatably move the head portion 140 along the internal side surface 31S, and control to irradiate light, but may also control to irradiate light in a state in which the head portion 140 is stopped after the head portion is rotatably moved along the internal side surface 31S.

In addition, the controller 150 may detect a position of a residue TC by image processing an image transmitted from a camera 145, and control a region to which the residue TC is attached to be intensively heated by moving the head portion 140 to the detected position. According to an example embodiment, the controller 150 may control the head portion 140 to make a pendulum movement based on the detected position of the residue TC.

In addition, the controller 150 may control power applied to the heating member 143 with reference to a temperature value (or other parameter or signal) transmitted from an internal temperature sensor 23 and a head portion temperature sensor 144. The controller 150 may cut off the power when the temperature value transmitted from the internal temperature sensor 23 exceeds a first reference threshold (e.g., first reference temperature). For example, the first reference threshold may be a first reference temperature of about 1000° C. In addition, when a temperature value transmitted from the head portion temperature sensor 144 of the controller 150 exceeds a second reference threshold (e.g., second reference temperature), power may be cut off. For example, the second reference threshold (e.g., second reference threshold) may be lower than the first reference threshold (e.g., first reference threshold). The second reference threshold may be a second reference temperature of about 300° C.

Thereafter, when a maintenance and repair operation is completed, the apparatus for removing a residue for an EUV light source vessel 100 may be withdrawn from an EUV light source vessel 10 through a door 31D.

As described above, the apparatus for removing a residue for an EUV light source vessel 100 may melt a residue TC attached to the EUV light source vessel 10, so that the residue TC may be easily removed. Accordingly, a time consumed for maintenance and repair of the EUV light source vessel 10 may be saved.

As set forth above, according to inventive concepts, an apparatus for removing a residue for an EUV light source vessel that can reduce a time required for a maintenance and repair operation of the EUV light source vessel may be provided.

Herein, a lower side, a lower portion, a lower surface, and the like, are used to refer to a direction toward a mounting surface of the fan-out semiconductor package in relation to cross-sections of the drawings, while an upper side, an upper portion, an upper surface, and the like, are used to refer to a direction opposite to the direction. However, these directions are defined for convenience of explanation, and the claims are not limited by the directions defined as described above.

The meaning of a "connection" of a component to another component in the description includes an indirect connection through an adhesive layer as well as a direct connection between two components. In addition, "electrically connected" conceptually includes a physical connection and a physical disconnection. It can be understood that when an element is referred to with terms such as "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an example embodiment" used herein does not refer to the same example embodiment, and is provided to emphasize a particular feature or characteristic different from that of another example embodiment. However, example embodiments provided herein are considered to be able to be implemented by being combined in whole or in part one with one another. For example, one element described in a particular example embodiment, even if it is not described in another example embodiment, may be understood as a description related to another example embodiment, unless an opposite or contradictory description is provided therein.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

Terms used herein are used only in order to describe example embodiments rather than limiting the present disclosure. In this case, singular forms include plural forms unless interpreted otherwise in context.

While example embodiments have been shown and described above, it will be apparent to those skilled in the art that modifications and variations could be made without departing from the scope of inventive concepts as defined by the appended claims.

What is claimed is:

1. An apparatus for removing a residue of an EUV light source vessel including an internal side surface having a curved surface, comprising:

a frame portion configured to be disposed on a bottom surface of the EUV light source vessel; and a head portion above the frame portion, the head portion being configured to be rotatably moved on a circular trajectory about a vertical axis through the frame portion while maintaining a distance from the curved surface of the EUV light source vessel, the head portion having a heating member configured to emit heat toward the curved surface of the EUV light source vessel, the heating member having a shape curved in an arc corresponding to a portion of the circular trajectory in which the head portion is configured to be rotatably moved.

2. The apparatus of claim 1, wherein the frame portion comprises:

a first plate;

a second plate spaced apart from the first plate;

a lifting assembly between the first plate and the second plate; and a rotation hardware assembly installed on the second plate and connected to the head portion, the rotation hardware assembly being configured to rotatably move the head portion.

3. The apparatus of claim 2, wherein the rotation hardware assembly further comprises:

a rotation shaft driver on the second plate;

a rotation shaft rotatably installed in the rotation shaft driver; and a support connecting the rotation shaft and the head portion, wherein the vertical axis through the frame portion extends through the rotation shaft.

4. The apparatus of claim 1, wherein the head portion further comprises:

a cover having an internal space in which the heating member is disposed; and a body supporting the cover, the body having an opening defining a region in which the cover is exposed toward an outside of the circular trajectory.

5. The apparatus of claim 4, wherein the cover is a quartz glass tube.

6. The apparatus of claim 4, wherein the cover further comprises a reflective surface on an inner surface.

7. The apparatus of claim 4, wherein the body further comprises a reflective surface in a region in contact with the cover.

8. The apparatus of claim 1, wherein the head portion further comprises a camera, the camera being configured to face the curved surface of the EUV light source vessel, and the camera is configured to form an image of one region of the curved surface of the EUV light source vessel.

9. The apparatus of claim 1, wherein the head portion further comprises a temperature sensor configured to measure a temperature of the head portion.

10. The apparatus of claim 1, wherein the heating member is a halogen lamp.

11. The apparatus of claim 1, wherein the frame portion comprises a first plate, a second plate spaced apart from the first plate, a lifting assembly between the first plate and the second plate, and a rotation hardware assembly installed on the second plate and connected to the head portion, the rotation hardware assembly is configured to rotatably move the head portion, the lifting assembly comprises a folding member and a connection bar, the folding member has one end connected to the first plate and an other end connected to the second plate, and the connection bar is connected to the folding member and configured to fold the folding member by rotation.

12. The apparatus of claim 11, wherein the folding member comprises:

a folding link portion having one end connected to the first plate and an other end connected to the second plate; and a connection portion connecting the folding link portion and configured to be moved along the connection bar.

13. An apparatus for removing a residue of an EUV light source vessel including an internal side surface having a curved surface and the residue attached to the curved surface, comprising:

a frame portion configured to be disposed on a bottom surface of the EUV light source vessel;

a head portion above the frame portion, the head portion being configured to be rotatably moved on a circular trajectory about a vertical axis through the frame portion while maintaining a distance from the curved surface of the EUV light source vessel, the head portion having a heating member configured to emit heat toward the curved surface of the EUV light source vessel, the heating member having a shape curved in an arc corresponding to a portion of the circular trajectory in which the head portion is configured to be rotatably moved; and a controller configured to control power applied to the heating member.

14. The apparatus of claim 13, wherein the head portion further comprises a camera, the camera is configured to face the curved surface of the EUV light source vessel, the camera is configured to form an image of one region of the curved surface of the EUV light source vessel, and the controller is configured to detect a position of the residue on the curved surface based on the image to provide a detected residue.

15. The apparatus of claim 14, wherein the controller is configured to rotatably move the head portion to a position of the detected residue.

16. The apparatus of claim 15, wherein the controller is configured to make a pendulum movement of the head portion around the position of the residue.

17. The apparatus of claim 14, wherein the head portion further comprises a first temperature sensor configured to measure a temperature of the head portion, and the controller is configured to cut off the power in response to the temperature measured by the first temperature sensor exceeding a first reference threshold.

18. The apparatus of claim 17, further comprising:

at least one second temperature sensor configured to be on the curved surface of the EUV light source vessel and configured to measure a temperature of the curved surface, wherein the controller is configured to cut off the power in response to the temperature measured by the second temperature sensor exceeding a second reference threshold.

19. The apparatus of claim 18, wherein the first reference threshold is higher than the second reference threshold.

20. An apparatus for removing a residue of an EUV light source vessel, comprising:
- a frame portion; and
- a head portion above the frame portion, the head portion configured to be rotatably moved on a circular trajectory about a vertical axis through the frame portion and to emit heat toward an outside of the circular trajectory,
- the head portion including a heating member, a cover, and a body,
- the heating member having a shape curved in an arc corresponding to a portion of the circular trajectory in which the head portion is configured to be rotatably moved,
- the cover having an internal space in which the heating member is disposed,
- the body supporting the cover, and
- the body having an opening defining a region in which the cover is exposed toward an outside of the circular trajectory.

\* \* \* \* \*